United States Patent [19]
Cousy

[11] Patent Number: 6,060,793
[45] Date of Patent: May 9, 2000

[54] ELECTRONIC SWITCH

[75] Inventor: Jean-Pierre Cousy, Verneuil sur Vienne, France

[73] Assignees: Legrand; Legrand SNC, both of Limoges, France

[21] Appl. No.: 09/138,575

[22] Filed: Aug. 24, 1998

[30] Foreign Application Priority Data

Aug. 22, 1997 [FR] France .................................. 97 10574

[51] Int. Cl.$^7$ .................................................. H01H 47/00
[52] U.S. Cl. ........................................... 307/125; 307/139
[58] Field of Search ................................... 307/112, 113, 307/116, 125, 126, 130, 131, 139

[56] References Cited

U.S. PATENT DOCUMENTS

| | | | |
|---|---|---|---|
| 3,644,755 | 2/1972 | Shaw | 327/456 |
| 3,806,739 | 4/1974 | Irie et al. | 327/461 |
| 3,809,965 | 5/1974 | Groth et al. | |
| 3,858,132 | 12/1974 | Long et al. | 335/153 |
| 3,979,644 | 9/1976 | Everhart | 361/91 |
| 4,328,459 | 5/1982 | Mcleod, Jr. | 323/300 |
| 4,459,531 | 7/1984 | Dumont et al. | |
| 4,751,401 | 6/1988 | Beigel et al. | 307/140 |
| 4,820,934 | 4/1989 | Marcade et al. | 307/41 |
| 5,747,973 | 5/1998 | Robitaille et al. | 307/39 |

FOREIGN PATENT DOCUMENTS

| | | | |
|---|---|---|---|
| 2579008 | 9/1986 | France | H01H 9/54 |
| 1762738 | 2/1971 | Germany . | |

OTHER PUBLICATIONS

Charles A. Schuler, Electronics: Principles and Applications (5th ed.) pp. 388–392 no month, 1994.
G. Hall "Triacs can misfire with the wrong triggering", vol. 45, No. 544, Jun. 1973.
Stevens "A.C. full–wave static switc", vol. 10, No. 1, Jan. 1977.
Christ "Leistungssteuerung und–regelung mit Triacs", vol. 26, No. 12, Dec. 1977.
Mc Nulty Power switching using solid–state relay, Mar. 26–30, 1973.
Howell et al "Applying SCR's to Consumer Products", vol. 25, No. 7, Jul. 1966.

*Primary Examiner*—Jeffrey Gaffin
*Assistant Examiner*—Peter Zura
*Attorney, Agent, or Firm*—Young & Thompson

[57] ABSTRACT

An electronic switch has an input terminal, an output terminal and an electronic switch unit between the input terminal and the output terminal controlled by a control circuit which extends from its anode to its trigger and is under the control of an actuator which the user can operate directly or indirectly. There is a current limiter resistor in series with said control circuit. The value of the current limiter resistor is less than the value of the voltage on triggering of the electronic switch unit divided by the minimal trigger current needed by the electronic switch unit for such triggering. It is in the order of 40 ohms at most, for example. Applications include controlling a load without generating spurious harmonics which are a problem on the mains supply.

8 Claims, 1 Drawing Sheet

ELECTRONIC SWITCH

BACKGROUND OF THE INVENTION

1. Field of the Invention

The present invention concerns electronic switches having an input terminal and an output terminal by which they can be inserted into the power circuit of a load to be controlled and an electronic switch unit, for example a triac, between said input terminal and said output terminal, controlled by a control circuit under the control of an actuator that the user can operate on directly or indirectly.

2. Description of the Prior Art

At present the control circuit usually benefits from a particular power supply which, at the cost of appropriate additional wiring, is taken directly between live and neutral of the corresponding power circuit. In practice this is the case in most practical implementations commonly used.

Consideration has nevertheless been given to making the control circuit from the anode to the trigger of the electronic switch unit, which avoids all additional wiring and which has the further advantage of automatic triggering of the electronic switch unit when the current passes through zero.

This control circuit then inevitably includes a series current limiter resistor the value of which must be appropriate to procuring the required triggering and which for this reason is frequently called the trigger resistor.

At present received wisdom is that the value of the current limiter resistor must be relatively high, in practice in the order of 100 ohms.

In conjunction with the inevitable internal capacitance between the trigger and the anode of the electronic switch device the current limiter resistor constitutes a filter.

Just as inevitable is a resulting phase-shift between the current and the voltage.

If the value of the current limiter resistor is high, the angle of this phase-shift, commonly known as the conduction angle, is sufficiently high for the corresponding voltage to be high when the current passes through zero and thus on triggering.

This leads to the unwanted generation of spurious harmonics in the power circuit that can be a problem on the corresponding mains supply.

To avoid this problem, which is necessary to comply with standards in this area, it is currently standard practice to insert a smoothing coil in the power circuit.

However, apart from its non-negligible cost and the implied assembly costs, the smoothing coil has the major disadvantage of causing high heat dissipation.

When used in a confined space, for example inside a pattress, this heat dissipation leads in practice to a significant reduction in the rupture capacity of the electronic switch unit employed in order to comply with the limit temperature that is not to be exceeded.

The rupture capacity is usually halved.

Another solution known in itself is to replace the current limiter resistor with a capacitor.

This has the drawback of introducing a phase-shift of 90° between the current and the voltage.

A general object of the present invention is an arrangement that avoids these drawbacks.

It is based on the previously unformulated observation that it is possible, without compromising operation, to choose the value of the current limiter resistor so that the conduction angle produces only acceptable spurious harmonics.

SUMMARY OF THE INVENTION

To be more precise, the present invention consists in an electronic switch having an input terminal, an output terminal, an electronic switch unit between said input terminal and said output terminal controlled by a control circuit which extends from its anode to its trigger and which is under the control of an actuator which the user can operate directly or indirectly and a current limiter resistor in series with said control circuit, wherein the value of said current limiter resistor is less than the value of the voltage on triggering of the electronic switch unit divided by the minimal trigger current needed by the electronic switch unit for such triggering.

The value of the current limiter resistor is at most in the order of 40 ohms, for example.

With a current limiter resistor value this small, the conduction angle itself has a limited value, which is in practice in the order of a few tenths of a degree at most.

Consequently, the voltage when the current passes through zero remains much less than one tenth the maximal amplitude of this voltage, being at most in the order of a few volts, for example, so that the corresponding spurious harmonics remain within acceptable limits without constituting a real problem in the power circuit concerned, which is the required result.

The electronic switch of the invention has other advantages.

First of all, it can advantageously be implemented using only a minimal number of components.

It can advantageously be controlled by touch-sensitive switches and so benefit from the limited travel and low noise advantages of the latter.

Operating entirely between live in and live out, with no connection to the neutral, the electronic switch of the invention can advantageously be remote controlled.

It is also advantageously able to disconnect high-power electrical loads, whether fluorescent loads or incandescent loads, at low cost, within a compact overall size, without causing arcing likely to lead to significant deterioration of any electrical contacts, and complying with applicable standards in the area of heat dissipation, even in a pattress.

If necessary, thermal protection can also be provided by using a positive temperature coefficient resistor as the current limiter resistor.

In accordance with one development of the invention, the electronic switch of the invention advantageously lends itself to the construction of a two-way switching circuit.

To this end it therefore includes two electronic switch units in parallel, each associated with a separate output terminal and the control circuits of which have a common current limiter resistor and a common actuator, the actuator then being a switch adapted to close one or other of the control circuits alternately.

Features and advantages of the invention will emerge further from the following description given by way of example with reference to the accompanying diagrammatic drawing.

DETAILED DESCRIPTION OF THE PREFERRED EMBODIMENT

Figure 1:
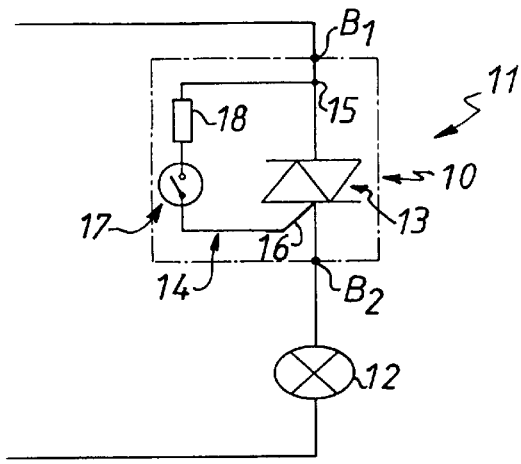
FIG. 1 is a block schematic of an electronic switch in accordance with the invention.

Referring to FIG. 1, a switch 10 in accordance with the invention includes, in a manner that is known in itself, an input terminal B1 and an output terminal B2 by means of which it can be inserted into a power circuit 11 serving the load 12 to be controlled and an electronic switch unit 13 between the input and output terminals controlled by a control circuit 14 which extends from its anode 15 to its trigger 16 and is under the control of an actuator 17 which the user can operate directly or indirectly. There is a current limiter resistor 18 in series with the control circuit 14.

Figure 2:
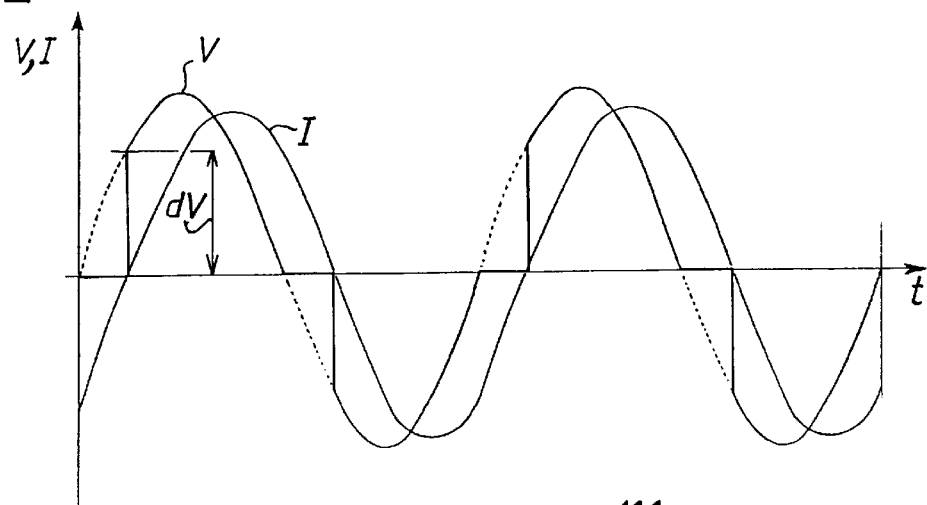
FIG. 2 is a diagram illustrating its operation.

In FIG. 2, in the usual way, time t is plotted on the horizontal axis and the voltage V across the electronic switch unit 13 and the current I passing through it are plotted on the vertical axis.

Let dV denote the voltage on triggering of the electronic switch unit 13, i.e. the value of the voltage V when the current I passes through zero.

In accordance with the invention, the value R of the current limiter resistor 18 is less than the value dv of the voltage when the electronic switch unit 13 triggers divided by the value $I_{GT}$ of the minimal trigger current needed by the electronic switch unit 13 to bring about this triggering.

In others words:

$$R = \frac{dV}{I_{GT}}$$

The value R of the current limiter resistor 18 is preferably in the order of 40 ohms at most.

It is then possible to obtain a voltage at most equal to 1 V with a trigger current in the order of 25 mA, for example.

In the embodiment shown the electronic switch unit 13 is a triac.

The actuator 17 can be a microswitch or a touch-sensitive switch, for example, accessible directly to the user in either case.

Alternatively, it can be any kind of switch adapted to be controlled indirectly, for example remote controlled.

If required, the current limiter resistor 18 employed can be a positive temperature coefficient resistor, which turns off the electronic switch device 13 by saturation of its trigger current in the event of an excessively high temperature in the unit in which the system is installed.

Figure 3:
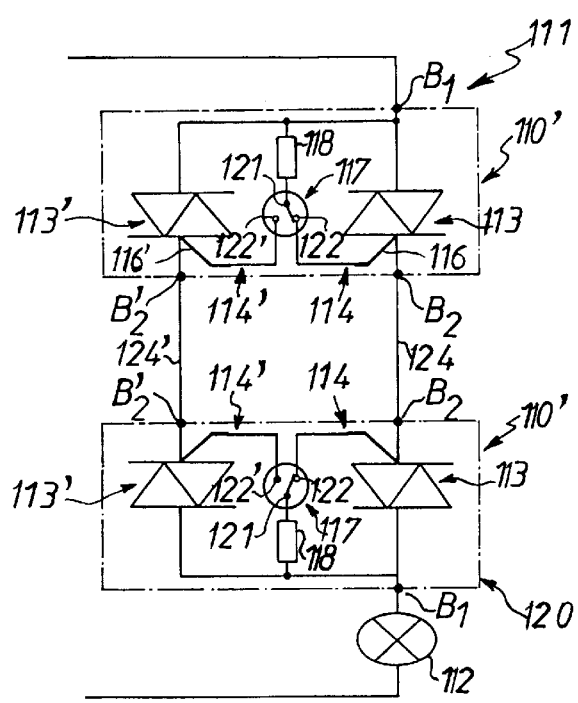
FIG. 3 is a block schematic of a two-way switching circuit using two electronic two-way switches of the invention.

As shown in FIG. 3, a two-way switching circuit 120 of the invention includes two two-way electronic switches 110 in inverse parallel.

For one of the electronic switches 110 the input terminal B1 is, as previously, on the side opposite the load 112 while, for the other electronic switch 110, it is To construct a two-way switching circuit 120 of this kind the electronic switch 110 of the invention has two electronic switch units 113, 113', each of which is associated with a separate output terminal B2, B'2 and the control circuits 14, 14' of which have a common current limiter resistor 118 and a common current actuator 117. The actuator 117 is then a switch adapted to close one or other of the control circuits 114, 114' alternately.

As shown here, for example, the actuator 117 then has its center terminal 121 connected to the current limiter resistor 118 and its lateral terminals 122, 122' are connected to the trigger 116, 116' of the electronic switch units 113, 113'.

The upper terminals B2 of the two electronic switches 110' are connected together by a wire 124 and their output terminals B'2 are connected together by a wire 124'.

The wires 124, 124' are in practice part of the corresponding electrical installation.

For each of the electronic switches 110' the electronic switch units 113, 113' are alternately on and off.

The system is on when the same electronic switch unit 113 or 113' is on in both of the two electronic switches 110' and off otherwise.

In either case it is possible to change the state of the system, and therefore to supply the load 112 with power or not, by operating one or other of the actuators 117.

Each time the actuator 117 is operated the electronic switch units 113, 113' of the corresponding electronic switch 110 both change state.

For example, in the configuration represented in FIG. 3, for each of the electronic switches 110', the electronic switch unit 113 is on, the electronic switch unit 113' is off and the load 112 is supplied with power.

If, starting from this configuration, the actuator 117 of one or other of the electronic switches 110' is operated the electronic switch unit 113 of that electronic switch 110' is turned off which cuts off the supply of power to the load 112.

If the actuator 117 of the other electronic switch 110' is then operated, the electronic switch units 113' of each of the two electronic switches 110' are turned on simultaneously, so that power is again supplied to the load 112, although the electronic switch unit 113 of the other electronic switch 110' is turned off in turn.

From the new configuration of the system, which is the opposite of the previous one, a process identical to that previously described takes place if the actuator 117 of one or other of the electronic switches 110' is operated.

Of course, the present invention is not limited to the embodiments described and shown but encompasses any variant execution thereof.

There is claimed:

1. An electronic switch having an input terminal and an output terminal, an electronic switch unit disposed between said input terminal and said output terminal, said switch unit including an anode and a trigger, a control circuit connected between said anode and said trigger, an actuator operable by a user for operating the control circuit, and a current limiter resistor disposed in series with said actuator, said current limiter resistance value being less than the triggering voltage value of said electronic switch unit divided by the minimum trigger current for triggering said electronic switch unit, whereby spurious harmonics of an associated power circuit are minimized.

2. An electronic switch according to claim 1, wherein the resistance value of said current limiter resistor is in the order of 40 ohms.

3. An electronic switch according to claim 1, wherein said electronic switch unit comprises a triac.

4. An electronic switch according to claim 1, further comprising another electronic switch unit disposed between said input terminal and another output terminal and also having anode and a trigger, said other electronic switch unit having a control circuit including said actuator and said current limiter resistor, said actuator selectively alternately closing one of said control circuits and opening the other of said control circuits and vice versa.

5. An electronic switch having an input terminal and an output terminal, an electronic switch unit disposed between said input terminal and said output terminal, said switch unit including an anode and a trigger, a control circuit connected between said anode and said trigger, an actuator operable by a user for operating the control circuit, and a current limiter resistor disposed in series with said actuator, said current limiter resistance value being less than the triggering voltage value of said electronic switch unit divided by the minimum trigger current for triggering said electronic switch unit, the voltage when current passes through zero being less than one-tenth the maximum amplitude of said voltage, whereby spurious harmonics of an associated power circuit are minimized.

6. An electronic switch according to claim 5, wherein the resistance value of said current limiter resistor is in the order of 40 ohms.

7. An electronic switch according to claim 5, wherein said electronic switch comprises a triac.

8. An electronic switch according to claim 5, further comprising another electronic switch unit disposed between said input terminal and another output terminal and also having anode and a trigger, said other electronic switch unit having a control circuit including said actuator and said current limiter resistor, said actuator selectively alternately closing one of said control circuits and opening the other of said control circuits and vice versa.

* * * * *